United States Patent [19]
Arakawa

[11] 4,355,375
[45] Oct. 19, 1982

[54] SEMICONDUCTOR MEMORY DEVICE

[75] Inventor: Hideki Arakawa, Yokohama, Japan

[73] Assignee: Fujitsu Limited, Kawasaki, Japan

[21] Appl. No.: 287,138

[22] Filed: Jul. 27, 1981

[30] Foreign Application Priority Data

Jul. 28, 1980 [JP] Japan ................................ 55/103504

[51] Int. Cl.³ ............................................. G11C 11/40
[52] U.S. Cl. ...................................... 365/185; 365/174
[58] Field of Search ................. 365/185, 174, 182, 104

[56] References Cited

U.S. PATENT DOCUMENTS 4,203,158  5/1980  Frohman-Bentchkowski et al. ......................................... 365/185
4,257,056  3/1981  Shum ................................... 365/185

OTHER PUBLICATIONS

"An Electrically Alterable Nonvolatile Memory Cell Using a Floating-Gate Structure", by D. C. Guterman et al., *IEEE Journal of Solid State Circuits*, vol. SC-14, No. 2, Apr. 1979, pp. 498-508.

Primary Examiner—Terrell W. Fears
Attorney, Agent, or Firm—Staas & Halsey

[57] ABSTRACT

A semiconductor memory device includes a plurality of floating gate transistors each of which comprises a semiconductor substrate, a first and second impurity doped region, channel region formed between the first and second impurity doped regions, a floating gate electrode formed on the channel region and separated into a plurality of portions at an intermediate portion of the channel region, and, a control gate formed on the floating gate and on the intermediate portion of the channel region. Part of the control gate is formed between the separated floating gate electrode portions and faces the channel region.

5 Claims, 10 Drawing Figures

SEMICONDUCTOR MEMORY DEVICE

BACKGROUND OF THE INVENTION

(1) Field of the Invention

The present invention relates to a semiconductor memory device, more particularly to a semiconductor non-volatile memory device, such as an EEPROM (Electrically Erasable and Programmable Read Only Memory) device or an EAROM (Electrically Alterable Read Only Memory) device which uses a floating-gate structure and which is used, for example, in an electronic computer.

(2) Description of the Prior Art

As illustrated in FIG. 1, in a conventional semiconductor nonvolatile memory device, wherein each of the memory cell transistors comprises a semiconductor substrate 1, a first impurity doped region 2 which is a source region, a second impurity doped region 3 which is a drain region, a floating gate 4 and a control gate 5. In FIG. 1, insulation films formed between the semiconductor substrate 1 and the floating gate 4 and formed at other portions and some other parts are omitted for the sake of simplicity.

In the memory cell transistor of FIG. 1, programming or write-in of information is achieved by simultaneously applying a predetermined bias voltage between the source region 2 and the drain region 3 and a high voltage, for example 20 V, to the control gate 5. Hot electrons are generated in the vicinity of the edge portion of the drain region 3 facing the channel region due to the avalanche break down and are injected into the floating gate 4 as illustrated by arrows in FIG. 1, resulting in an upward shift in the threshold voltage. Thus, only the operation in the enhancement mode is guaranteed.

After the above-mentioned write-in of information is achieved, electrical erasure can be attained by simultaneously applying the potential of 0 V to the source region 2 and the drain region 3 and a very high potential voltage, for example 30 V, to the control gate 5. Electrons stored in the floating gate 4 are injected into the control gate 5 by tunnel injection and are removed from the floating gate 4, so that the erasure of information is achieved. This tunnel injection is performed by Fowler-Nordheim emission.

When the above-mentioned erasure is effected, if too many electrons are removed from the floating gate 4, there occurs a condition which is as if positive holes were stored in the floating gate 4. Therefore, the memory cell transistor of FIG. 1 operates in the depletion mode, so that a drain source current flows even if the memory cell transistor is not selected, i.e., even if the gate potential is zero.

In order to solve such a problem, there is proposed the memory cell transistor of FIG. 2. In the memory cell transistor of FIG. 2, a part of a control gate 5, which is designated by the reference number 5', is formed directly on the channel region of the substrate 1 through an insulation layer formed therebetween (not shown in the drawing), so that a part of the channel region, on which is formed the part of the control gate 5, can be turned on and off directly by the control gate 5. The other portions are the same as those of FIG. 1 and are designated by the same reference numbers. In the structure of FIG. 2, even if a part of the channel region existing under the floating gate 4 operates in the depletion mode, the whole channel region between the source region 2 and the drain region 3 is controlled only by the control gate 5.

As illustrated in FIG. 3, in a process for manufacturing the memory device using the memory cell transistor of FIG. 2, the control gate and the floating gate are formed by trimming conductive layers 7 and 8 which are formed on the semiconductor substrate 1, by the photolithographic technique using a photoetching mask 9. After forming the control gate 5 and the floating gate 4, the source electrode 2 and the drain electrode 3 are formed, for example, by thermal diffusion.

However, the structure of FIG. 2 has a disadvantage in that it is necessary to adjust the position of the photoetching mask 9 very precisely when the trimming or the patterning of the control gate 5 is effected in the manufacturing process of the memory cell transistor. This is because, if the position of the photoetching mask 9 deviates, for example, in a direction illustrated by an arrow A from a predetermined normal position 9 to a position 9', then both the capacitance between the control gate 5 and the floating gate 4 and the capacitance between the floating gate 4 and the substrate 1 become larger. However, the area of the control gate 5, which faces the channel region and which is used for controlling the turning on and off of the channel region, becomes smaller than the predetermined value. Therefore such a deviation of the position of the photoetching mask causes dispersion of the electric characteristics of the memory cell transistors.

As illustrated in FIG. 4, in a semiconductor memory device using such memory cell transistors, the memory cell transistors $Q_{m,n}$, $Q_{m,n+1}$, $Q_{m+1,n}$, $Q_{m+1,n+1}$, ... are usually arranged in a matrix. Each of the memory cell transistors is disposed at an intersection of one of the word lines $WL_n$, $WL_{n+1}$, ... and one of bit lines $BL_m$, $BL_{m+1}$, ... The control gate of each of the memory cell transistors is connected to one of the word lines $WL_n$, $WL_{n+1}$, ..., and, the drain electrode and the source electrode thereof are connected to one of the bit lines $BL_m$, $BL_{m+1}$, ... and a voltage source $V_{ss}$, for example ground, respectively.

FIG. 5 illustrates a cross section of a pair of memory cell transistors, for example the memory cell transistors $Q_{m,n}$ and $Q_{m,n+1}$ of FIG. 4, which have a common drain electrode 3 connected to the bit line, for example, $BL_m$. In the structure of FIG. 5, if the photoetching mask (not shown in the drawing) deviates in a direction shown by an arrow B from the predetermined normal position, then both the capacitance between the control gate 5 and the floating gate 4 and the capacitance between the floating gate 4 and the substrate 1 of the transistor $Q_{m,n}$ become larger than the predetermined normal value. However, the corresponding capacitances of the transistor $Q_{m,n+1}$ become smaller than the predetermined normal value. In this case, the area 5' of the control gate 5 directly facing the channel region of the transistor $Q_{m,n}$ becomes smaller than the predetermined normal value, but the area 5' of the transistor $Q_{m,n+1}$ becomes larger than the predetermined normal value. Therefore, the electric characteristics of both transistors $Q_{m,n}$ and $Q_{m,n+1}$ change in reverse directions with each other, so that the dispersion of the electric characteristics of the memory cell transistors becomes very large.

SUMMARY OF THE INVENTION

It is the principal object of the present invention to provide a semiconductor memory device in which the electric characteristics of each memory cell transistor are not affected by the above-mentioned deviation of the position of a photoetching mask.

It is another object of the present invention to provide a semiconductor memory device in which the dispersion of the electric characteristics of each memory cell transistor can be kept very small.

According to the present invention, there is provided a semiconductor memory device containing a plurality of memory cell transistors each comprising: a semiconductor substrate formed by a semiconductor having a first conductivity type; first and second impurity doped regions having a second conductivity type and being formed on the semiconductor substrate; a channel region formed between the first and second impurity doped regions; a floating gate electrode formed on the channel region through an insulation film formed therebetween, the floating gate electrode existing at least at the regions on the channel region adjacent to the first and second impurity doped regions and being separated from each other at a region on an intermediate portion of the channel region; and a control gate electrode formed on the floating gate electrodes and on the intermediate portion of the channel region through an insulation film formed therebetween, a part of the control gate electrode formed between the separated floating gate electrode portions and facing the channel region through the insulation film.

DESCRIPTION OF THE PREFERRED EMBODIMENTS

Figure 6:
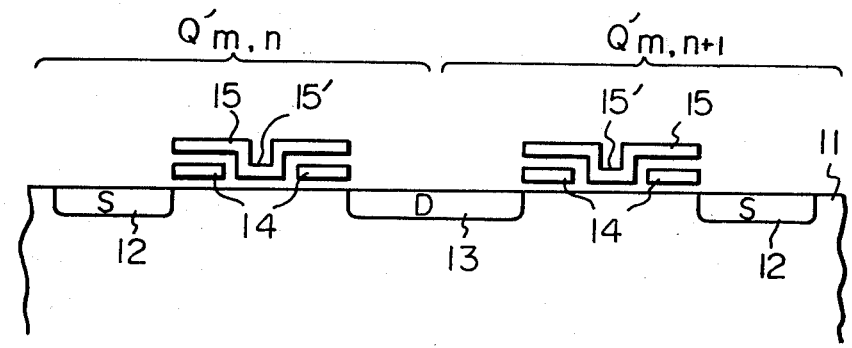
FIG. 6 is a cross sectional view illustrating floating gate transistors used in a memory device according to the present invention.
Figure 7:
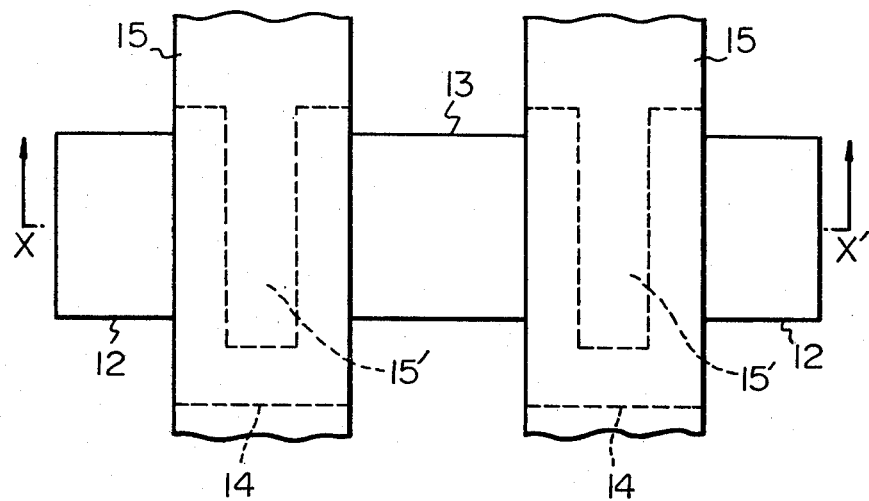
FIG. 7 is a plan view of the floating gate transistors of FIG. 6.

FIG. 6 illustrates a structure for memory cell transistors, i.e., floating gate transistors, used in a semiconductor memory device as an embodiment of the present invention. FIG. 7 is a plan view of the memory cell transistors of FIG. 6 and FIG. 6 is a cross sectional view taken on line X—X' of FIG. 7.

As illustrated in FIGS. 6 and 7, each of the memory cell transistors comprises a semiconductor substrate 11 made, for example, of a p-type silicone semiconductor, a source region 12 which is an impurity doped region having, for example, an $n^+$ conductivity, a drain region 13 which is an impurity doped region having the same conductivity type as that of the source region 12 and which region 13 is common to that of the other one transistor shown in the drawings, a floating gate 14 made of, for example, polycrystalline silicone, and a control gate 15 made of, for example, polycrystalline silicone. In these drawings, illustration of insulation layers existing between the control gate 15 and the floating gate 14 and between the floating gate 14 and the substrate 11 and so on is omitted for the sake of simplicity. These drawings designate a pair of memory cell transistors having a common drain region 13 which is connected to a bit line of the memory device.

Figure 8:
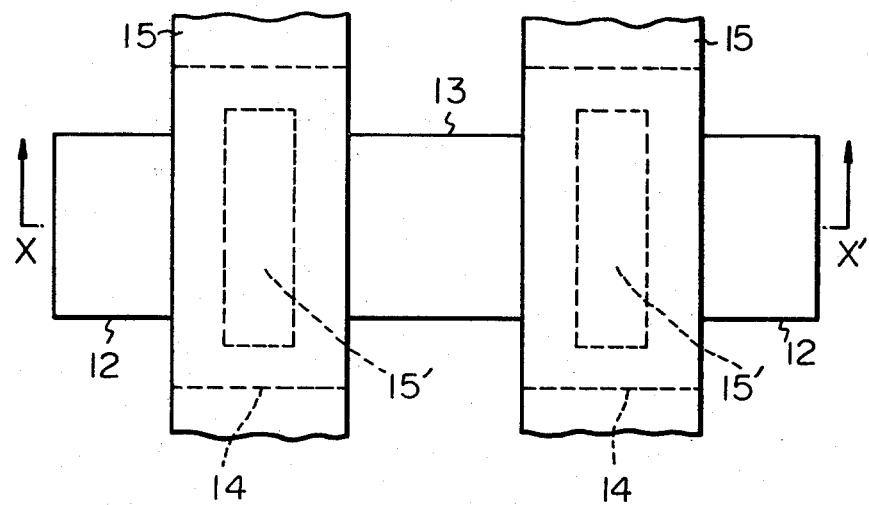
FIG. 8 is a plan view illustrating floating gate transistors used in a memory device as another embodiment of the present invention.

It should be noted that, in each of the memory cell transistors, the floating gate 14 is separated into two parallel portions on the channel region and the two parallel portions are joined together with each other at the ends thereof on the outside of the channel region, so that the floating gate 14 constitutes approximately a U-shaped area. Therefore, a part of the control gate 15, which is designated by a reference number 15' and which directly faces the channel region, is formed between the two separated portions of the floating gate 14 which are formed on the channel region. The floating gate 14 can also be formed as an O-shaped area as illustrated in FIG. 8. In this case, two separated parallel portions of each of the floating gates 14 on the channel region are joined together with each other at both ends on the outside of the channel region to form an O-shape.

Figure 1:
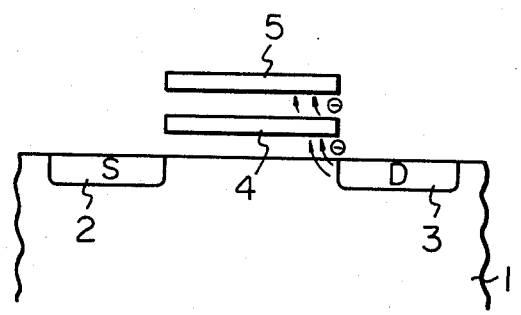
FIG. 1 is a cross sectional view illustrating a conventional floating gate transistor.
Figure 2:
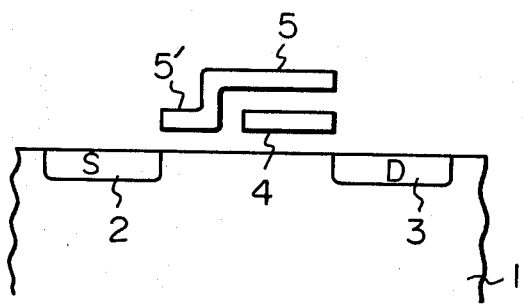
FIG. 2 is a cross sectional view illustrating another conventional floating gate transistor.
Figure 3:
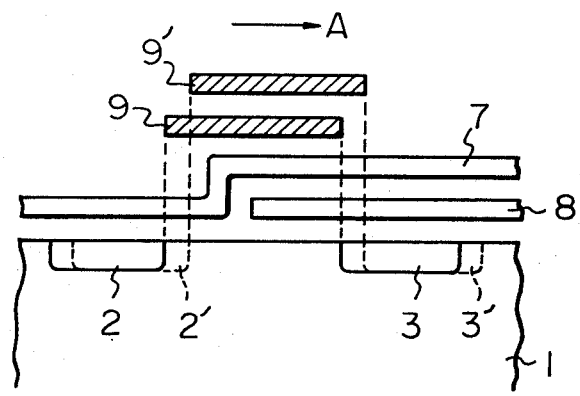
FIG. 3 is a cross sectional view illustrating a process for manufacturing the floating gate transistor of FIG. 2.
Figure 5:
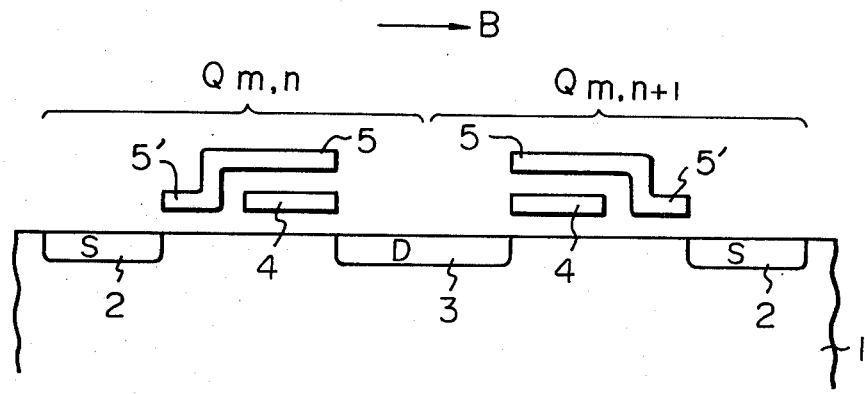
FIG. 5 is a cross sectional view illustrating a pair of memory cell transistors having a common drain electrode.

The operation of the above-mentioned memory cell transistor, for example write-in, read-out and erasure operations, is the same as that of the conventional memory cell transistor shown in FIG. 2 or FIG. 5. Therefore, the explanation thereof is omitted here.

Figure 4:
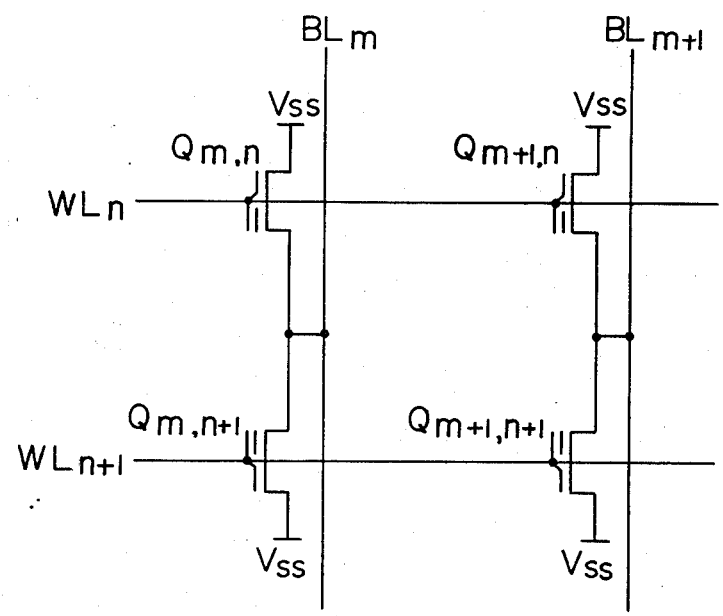
FIG. 4 is a circuit diagram illustrating an arrangement of memory cell transistors in a conventional memory device.
Figure 9:
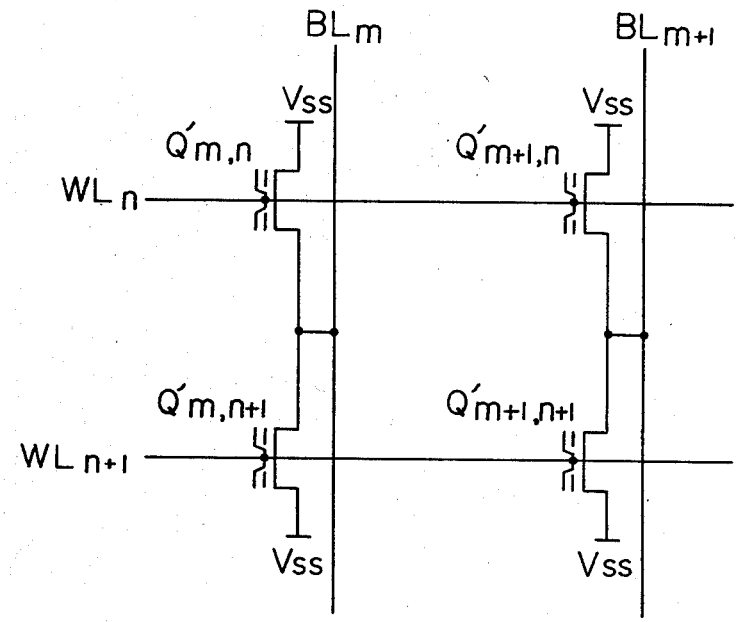
FIG. 9 is a circuit diagram illustrating an arrangement of memory cell transistors in a memory device according to the present invention.

The above-mentioned memory cell transistor can also be used in a nonvolatile semiconductor memory device. As illustrated in FIG. 9, such memory cell transistors $Q'_{m,n}$, $Q'_{m,n+1}$, $Q'_{m+1,n}$, $Q'_{m+1,n+1}$, ... are arranged in a matrix in a similar manner to the memory device of FIG. 4. The control gate of each of the memory cell transistors is connected to one of the word lines $WL_n$, $WL_{n+1}$, ... and, the drain electrode and the source electrode thereof are connected to one of the bit lines $BL_m$, $BL_{m+1}$, ... and a voltage source $V_{ss}$, for example ground, respectively.

Figure 10:
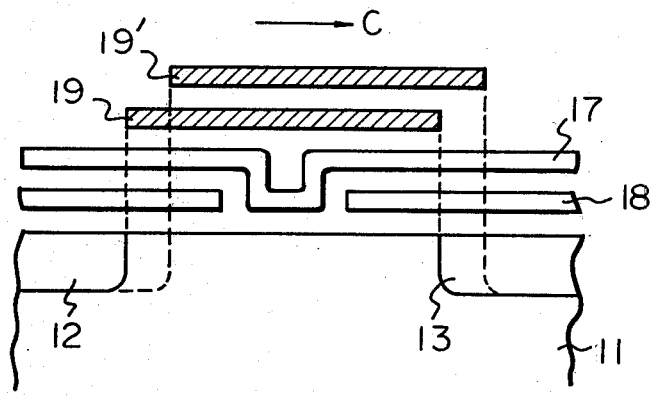
FIG. 10 is a cross sectional view illustrating a process for manufacturing the floating gate transistor of FIG. 6.

The structure of the aforementioned memory cell transistor of FIG. 6 has some advantages. As illustrated in FIG. 10, one of the advantages is that it is not necessary to adjust the position of a photoetching mask very precisely when the trimming of the control gate and the floating gate from the polycrystaline silicone layers 17 and 18 is effected in the manufacturing process of the memory cell transistor. This is because, as illustrated in FIG. 10, even if the position of the photoetching mask 19 deviates, for example, in a direction illustrated by an arrow C from a predetermined normal position 19 to a position 19', the total length of the floating gate 14 along the channel region does not change, and, both the capacitance between the control gate 15 and the floating gate 14 and the capacitance between the floating gate 14 and the substrate 11 do not change. The other advantage of the structure according to the present invention is that the control gate 15 and the floating gate 14 both can be trimmed by self alignment at both edges, i.e., the source side edge and the drain side edge, that is, the floating gate 14 is trimmed simultaneously with the control gate 15 by the photoetching mask 18 of the control gate 15. Therefore, the length of the portion 15' of the control gate 15, which directly faces the channel region and which is formed between the separate portions of the floating gate 14, does not change, even if the position of the photoetching mask 19 deviates in the above-mentioned manner. The length of the portion 15' of the control gate 15 is not affected by the dispersion of the condition of the diffusion in the process of forming the source region 12 and the drain region 13 after the control gate 15 and the floating gate 14 are formed by photolithography, and the precision of the length of the portion 15' depends only on the precision of the photoetching process to form the floating gate 14.

As mentioned above, according to the present invention, the electric characteristics of each floating gate transistor are not affected by the deviation of the position of a photoetching mask and the dispersion of the electric characteristics can be made very small.

I claim:

1. A semiconductor memory device having a plurality of memory cell transistors each of which comprises:
    a semiconductor substrate of a first conductivity type;
    first and second impurity doped regions of a second conductivity type formed in said semiconductor substrate to define a channel region which extends between said first and second impurity doped regions;
    an insulation film formed on said channel region;
    a floating gate electrode formed on said insulation film, said floating gate electrode having first and second portions facing the portions of said channel region adjacent to said first and second impurity doped regions, respectively, said first and second portions of said floating gate electrode being separated from each other over an intermediate portion of said channel region, said first and second portions being connected at a position outside the channel region;
    a control gate electrode formed over said first and second portions of said floating gate electrode and on said insulation film over said intermediate portion of said channel region, a part of said control gate electrode facing said intermediate portion of said channel region.

2. A semiconductor memory device as claimed in claim 1, wherein said floating gate electrode is separated into two parallel portions over said channel region, wherein said two parallel portions are coupled to each other at the ends thereof outside of said channel region, and wherein said floating gate electrode has a substantially U-shaped area.

3. A semiconductor memory device as claimed in claim 1, wherein said floating gate electrode is separated into two parallel portions over said channel region, wherein said two parallel portions are joined to each other at both ends outside of said channel region, and wherein said floating gate electrode has a substantially O-shaped area.

4. A semiconductor memory device as claimed in claim 1, 2 or 3, wherein said memory cell transistors are arranged in a memory matrix comprising a plurality of bit lines and a plurality of word lines, said control gate electrode of each of said memory cell transistors being connected to one of said plurality of word lines and the drain region of each of the memory cell transistors being connected to one of said plurality of bit lines.

5. A semiconductor memory device having a plurality of memory cell transistors, each of said plurality of memory cell transistors comprising:
    a semiconductor substrate of a first conductivity type;
    a first insulation film formed on said semiconductor substrate;
    a floating gate electrode having first and second portions formed on said first insulating film;
    a second insulating film formed on said first and second portions of said floating gate electrode;
    a control gate electrode formed on said second insulating film overlying said first and second portions of said floating gate electrode and formed over the region of said first insulating film between said first and second portions of said floating gate electrode; and
    first and second impurity doped regions having a second conductivity type and formed in said semiconductor substrate adjacent said first and second portions of said floating gate electrode to define a channel region which extends between said first and second impurity doped regions, the part of said control gate electrode between the first and second portions of said floating gate electrode facing said channel region.

* * * * *

UNITED STATES PATENT AND TRADEMARK OFFICE
CERTIFICATE OF CORRECTION

PATENT NO. : 4,355,375
DATED : OCTOBER 19, 1982
INVENTOR(S) : HIDEKI ARAKAWA.

It is certified that error appears in the above-identified patent and that said Letters Patent is hereby corrected as shown below:

Title page, [56] References Cited, "Frohman-Bentchkowski et al" should be
--Frohman-Bentchkowsky et al--;

[57] Abstract, line 4, after "substrate," delete "a";

line 5, "region" should be --regions, a--.

Signed and Sealed this

First Day of March 1983

[SEAL]

Attest:

GERALD J. MOSSINGHOFF

Attesting Officer

Commissioner of Patents and Trademarks